United States Patent
Ouyang et al.

(10) Patent No.: US 11,762,698 B2
(45) Date of Patent: Sep. 19, 2023

(54) TECHNIQUES TO ENABLE STATEFUL DECOMPRESSION ON HARDWARE DECOMPRESSION ACCELERATION ENGINES

(71) Applicant: ScaleFlux, Inc., San Jose, CA (US)

(72) Inventors: Linqiang Ouyang, Livermore, CA (US); Mark Vernon, Park City, UT (US); Dan Liu, San Jose, CA (US); Jinchao Lyu, San Jose, CA (US); Yang Liu, Milpitas, CA (US)

(73) Assignee: SCALEFLUX, INC., San Jose, CA (US)

( * ) Notice: Subject to any disclaimer, the term of this patent is extended or adjusted under 35 U.S.C. 154(b) by 321 days.

(21) Appl. No.: 17/351,298

(22) Filed: Jun. 18, 2021

(65) Prior Publication Data

US 2022/0405142 A1   Dec. 22, 2022

(51) Int. Cl.
  *G06F 9/50* (2006.01)
  *H03M 7/30* (2006.01)
  *G06F 9/54* (2006.01)

(52) U.S. Cl.
  CPC ............ *G06F 9/5027* (2013.01); *G06F 9/544* (2013.01); *H03M 7/30* (2013.01)

(58) Field of Classification Search
  CPC ........ G06F 9/5027; G06F 9/544; H03M 7/30; H03M 7/3071; H03M 7/6017; H03M 7/6058; H03M 7/6005
  See application file for complete search history.

(56) References Cited

U.S. PATENT DOCUMENTS

| | | | | |
|---|---|---|---|---|
| 5,719,998 A | * | 2/1998 | Ku | G06T 9/007 704/258 |
| 7,492,290 B1 | * | 2/2009 | Schneider | H03M 7/3086 341/87 |
| 2002/0178332 A1 | * | 11/2002 | Wilson | G06F 12/08 711/207 |
| 2003/0028673 A1 | * | 2/2003 | Lin | H04L 67/568 709/218 |
| 2009/0284400 A1 | * | 11/2009 | Gui | G06F 16/10 341/60 |
| 2010/0020825 A1 | * | 1/2010 | Bass | H04L 69/04 370/477 |
| 2015/0019834 A1 | * | 1/2015 | Loh | G06F 12/0868 711/208 |
| 2017/0177404 A1 | * | 6/2017 | Drysdale | G06F 9/5061 |
| 2017/0187388 A1 | * | 6/2017 | Satpathy | H03M 7/6011 |

* cited by examiner

*Primary Examiner* — Farley Abad
(74) *Attorney, Agent, or Firm* — Hoffman Warnick LLC

(57) ABSTRACT

A hardware decompression acceleration engine including: an input buffer for receiving to-be-decompressed data from a software layer of a host computer; a decompression processing unit coupled to the input buffer for decompressing the to-be-decompressed data, the decompression processing unit further receiving first and second flags from the software layer of the host computer, wherein the first flag is indicative of a location of the to-be-decompressed data in a to-be-decompressed data block and the second flag is indicative of a presence of an intermediate state; and an output buffer for storing decompressed data from the decompression processing unit.

12 Claims, 6 Drawing Sheets

TECHNIQUES TO ENABLE STATEFUL DECOMPRESSION ON HARDWARE DECOMPRESSION ACCELERATION ENGINES

TECHNICAL FIELD

The present invention relates to the field of data compression and decompression, and to improving efficiency and throughput of hardware decompression acceleration engines.

BACKGROUND

Lossless data compression is widely used in data storage and communication systems to reduce cost and/or improve speed performance. In current practice, lossless data compression/decompression is mostly implemented at either the application level (e.g., various databases) or filesystem level (e.g., ZFS and HDFS). Nevertheless, application-level and file system-level data compression/decompression is subject to noticeable overhead in terms of CPU usage and memory data movement.

Compression/decompression can also be off-loaded to dedicated hardware acceleration engines, which can relieve CPU resources from compression/decompression. Many decompression libraries (e.g., deflate) support stateful decompression, i.e., when decompressing a compressed data block, the decompression process can suspend and resume one or multiple times instead of continuously decompressing the entire compressed data block without a break. Support of stateful decompression is desirable or even necessary for many scenarios, e.g., the entire compressed data block becomes available to the decompression engine only portion-by-portion.

To support stateful decompression, the decompression session must store intermediate state information that may consume tens of KB of memory resources. For CPU-based software decompression, because of the large amount of host memory capacity (e.g., tens of GBs), it is relatively easy to support stateful decompression for a large number of concurrent decompression sessions. However, hardware decompression acceleration engines typically do not have much memory resources, and hence cannot store the intermediate state information for a large number of concurrent decompression sessions. As a result, it is a challenge for hardware decompression acceleration engines to effectively support stateful decompression.

SUMMARY

Accordingly, embodiments of the present disclosure are directed to techniques for improving the efficiency and throughput of hardware decompression acceleration engines. Further embodiments of the present disclosure are directed to techniques for enhancing hardware decompression acceleration system design to support stateful decompression for a large number of concurrent decompression sessions.

A first aspect of the disclosure is directed to a hardware decompression acceleration engine. According to embodiments, the hardware decompression acceleration engine includes: an input buffer for receiving to-be-decompressed data from a software layer of a host computer; a decompression processing unit coupled to the input buffer for decompressing the to-be-decompressed data, the decompression processing unit further receiving first and second flags from the software layer of the host computer, wherein the first flag is indicative of a location of the to-be-decompressed data in a to-be-decompressed data block and the second flag is indicative of a presence of an intermediate state; and an output buffer for storing decompressed data from the decompression processing unit.

A second aspect of the disclosure is directed to a hybrid software and hardware decompression system. According to embodiments, the hybrid software and hardware decompression system includes: a host computer including a software layer and a memory; and a hardware decompression acceleration engine coupled to the host computer, wherein the hardware decompression acceleration engine includes: an input buffer for receiving to-be-decompressed data from the software layer of the host computer; a decompression processing unit coupled to the input buffer for decompressing the to-be-decompressed data, the decompression processing unit further receiving first and second flags from the software layer of the host computer, wherein the first flag indicates whether the to-be-decompressed data received by the input buffer from the software layer of the host computer is a last portion of a to-be-decompressed data block and the second flag is indicative of a presence of an intermediate state; and an output buffer for storing decompressed data from the decompression processing unit.

A third aspect of the disclosure is directed to a hybrid software and hardware decompression method. According to embodiments, the hybrid software and hardware decompression method includes: receiving, at an input buffer of a hardware decompression acceleration engine coupled to a host computer, to-be-decompressed data from a software layer of the host computer, the hardware decompression acceleration engine further including a decompression processing unit and an output buffer; decompressing the to-be-decompressed data via the decompression processing unit; receiving, at the decompression processing unit, first and second flags from the software layer of the host computer, wherein the first flag indicates whether the to-be-decompressed data received by the input buffer from the software layer of the host computer is a last portion of a to-be-decompressed data block and the second flag is indicative of a presence of an intermediate state; storing decompressed data from the decompression processing unit in the output buffer; and sending the decompressed data in the output buffer to the software layer of the host computer.

BRIEF DESCRIPTION OF THE DRAWINGS

The numerous advantages of the present disclosure may be better understood by those skilled in the art by reference to the accompanying figures.

DETAILED DESCRIPTION

Reference will now be made in detail to embodiments of the disclosure, examples of which are illustrated in the accompanying drawings.

Figure 1:
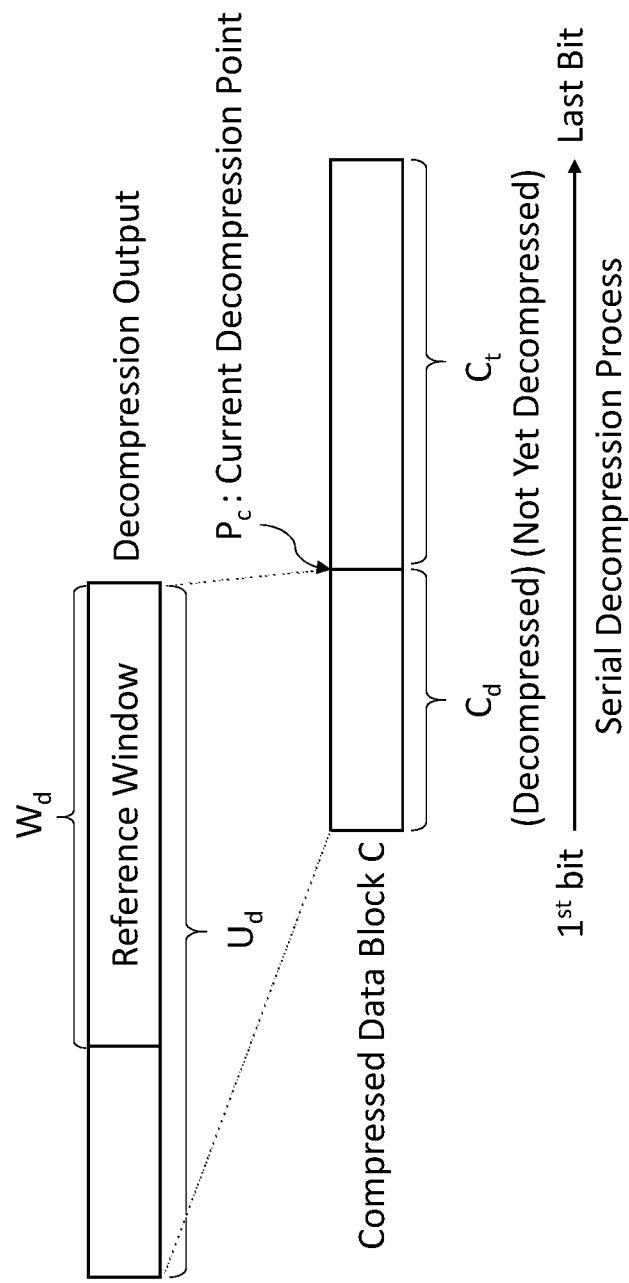
FIG. 1 illustrates a serial decompression process and an intermediate state during the decompression

FIG. 1 illustrates a serial decompression process and an intermediate state during the decompression. When decompressing a compressed data block to reconstruct the original uncompressed data block, all of the bits in the compressed data block must be serially processed from the beginning to the end. During the serial bit-by-bit decompression process, a certain range of the most recently decompressed data (called a reference window) is used as a reference to decompress the current bits. For a given decompression algorithm (e.g., deflate), the maximum size of the reference window is a fixed parameter (e.g., 32K-bytes in deflate). During the decompression process, we define the "intermediate state" as the collection of (1) the current decompression bit position (i.e., the bit position that the decompression process has moved to—all the bits ahead of this bit position have been decompressed and all the bits behind this bit position have not yet been decompressed), and (2) the content of the current reference window.

As illustrated in FIG. 1, suppose the serial decompression process has reached the position $P_c$ on a compressed data block C, and let $C_d$ denote the portion that has been decompressed, Ct denote the portion that has not yet been decompressed, and $U_d$ denote the correspondingly reconstructed original data. Let $|U_d|$ denote the size of the so-far decompressed data $U_a$, and $W_d$ denote the maximum decompression reference window size (e.g., 32K-bytes in deflate). The reference window thus has a size of $\min(|U_d|, W_d)$. As the decompression process continues, the content of the intermediate state keeps changing while its size remains as $\min(|U_d|, W_d)$.

To support stateful decompression, the decompression process must be able to suspend the on-going decompression operation and store the current intermediate state in memory, and at a later time resume the decompression operation by restoring the intermediate state from memory.

Figure 2:
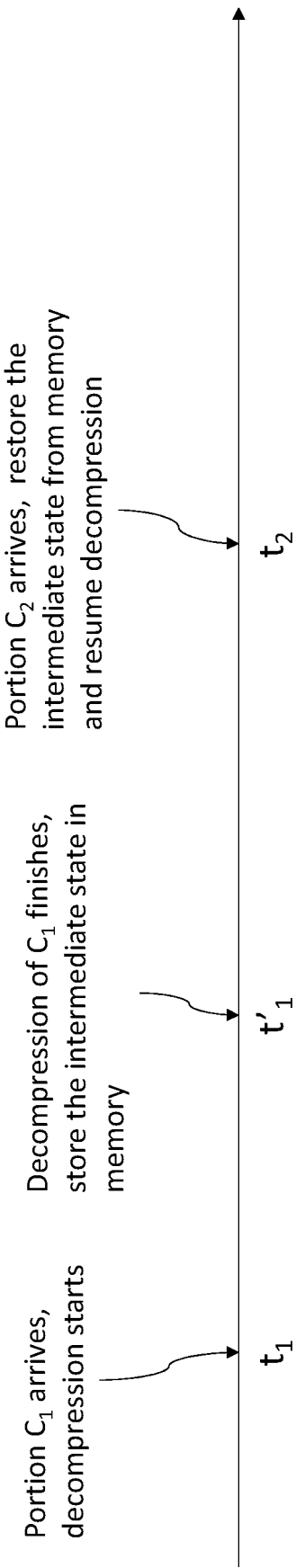
FIG. 2 illustrates the support of stateful decompression by storing the intermediate state to memory and restoring the intermediate state from memory.

As illustrated in FIG. 2, suppose two portions of the compressed block C (i.e., $C_1$ and $C_2$) are made available to the decompression process at the time $t_1$ and $t_2$, respectively. The decompression process finishes decompressing the portion $C_1$ at a time $t'_1$ that is earlier than $t_2$. Accordingly, the decompression process must store the current intermediate state to memory, and then either wait for the next portion $C_2$ or switch to work on another compressed block. Once the second portion $C_2$ arrives at the time $t_2$, the decompression process must restore the intermediate state from memory and start to decompress the portion $C_2$.

Let N denote the total number of concurrent decompression sessions. To support stateful decompression for all of the decompression sessions, the system must store up to N different intermediate states in memory with a total size of up to $N \cdot W_d$. If the value of N is large, the system must consume a relatively large amount of memory capacity to store all of the intermediate states. Although this may not be an issue for modern computers with abundant system memory resources (e.g., tens of GBs), hardware decompression acceleration engines typically have limited memory resources (e.g., hundreds of KBs), and therefore may not easily support stateful decompression for a large number of concurrent decompression sessions. As a result, many existing hardware decompression acceleration engines do not support stateful decompression at all, and hence user applications must pass each to-be-decompressed block entirely at once to hardware decompression acceleration engines.

Accordingly, embodiments of the present disclosure are directed to techniques for enabling stateful decompression when using hardware decompression acceleration engines.

Figure 3:
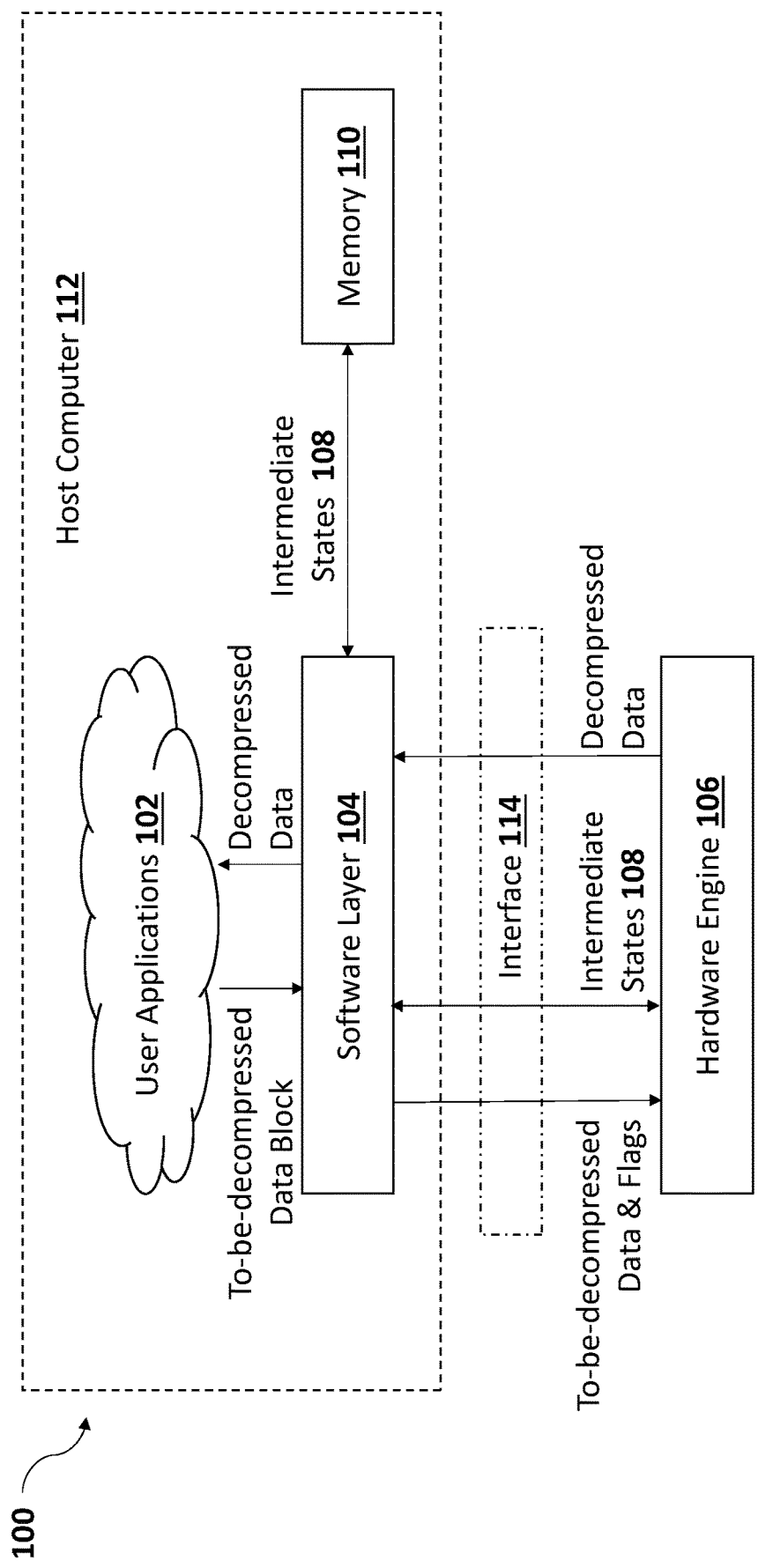
FIG. 3 illustrates a hybrid-software/hardware architecture in accordance with embodiments of the disclosure.

FIG. 3 illustrates a hybrid-software/hardware architecture 100 in accordance with embodiments of the disclosure, which is configured to support stateful decompression for user applications 102. The hybrid-software/hardware architecture 100 may include a software layer 104 and a hardware decompression acceleration engine 106 (hereafter hardware engine 106). According to embodiments, the software layer 104 is responsible for storing the intermediate states 108 in memory 110 and interfacing with user applications 102, while the hardware engine 106 carries out the decompression operations. As indicated in FIG. 3, the user applications 102, software layer 104, and memory 110 may be provided in a host computer 112. The hardware engine 106 may be coupled to the host computer 112 via a suitable hardware interface 114.

Hardware Architecture

Figure 4:
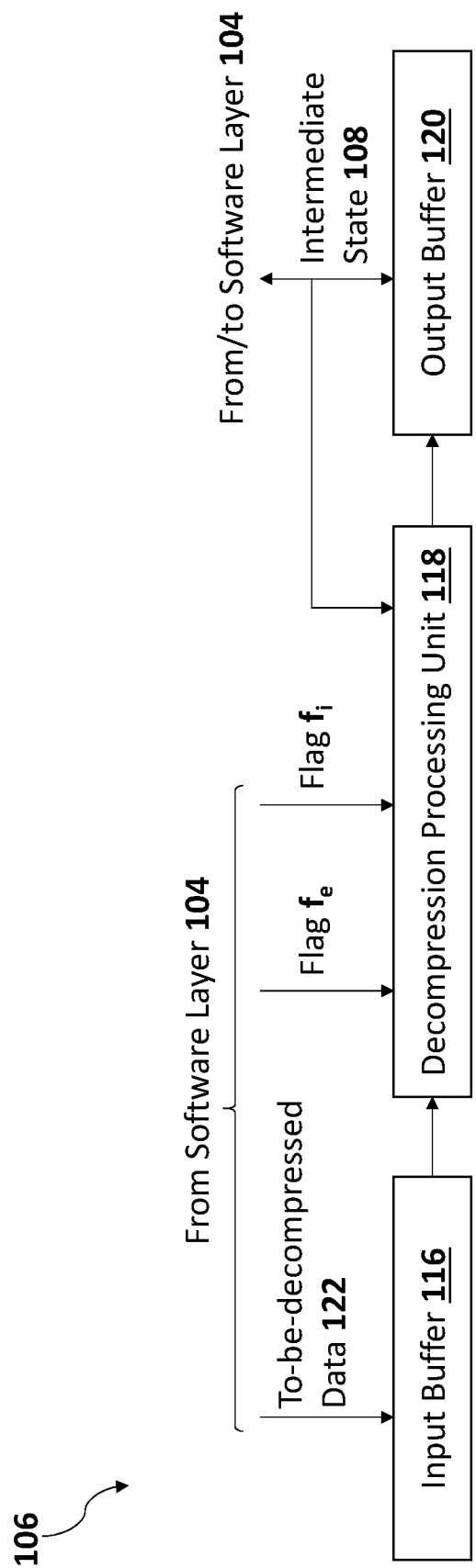
FIG. 4 illustrates the structure of the hardware engine of the hybrid-software/hardware architecture according to embodiments of the disclosure.

FIG. 4 illustrates the structure of the hardware engine 106 of the hybrid-software/hardware architecture 100 according to embodiments of the disclosure. As illustrated in FIG. 4, the hardware engine 106 may include several components including an input buffer 116, a decompression processing unit 118, and an output buffer 120.

According to embodiments, the input buffer 116 of the hardware engine 106 is configured to hold to-be-compressed data 122 received from the software layer 104 of the host computer 112. The decompression processing unit 118 of the hardware engine 106 is configured to carry out decompression on the to-be-compressed data 122 in the input buffer 116 to generate a decompressed bitstream, which is stored in the output buffer 120 of the hardware engine 106.

As further illustrated in FIG. 4, the decompression processing unit 118 of the hardware engine 106 receives the intermediate state 108, a flag $f_e$, and a flag $f_i$ from the software layer 104 of the host computer 112. According to embodiments of the disclosure, the flag $f_e$ indicates whether the to-be-decompressed data 122 received by the input buffer 116 of the hardware engine 106 from the software layer 104 of the host computer 112 is the last portion in an entire to-be-decompressed data block. The flag $f_i$ indicates whether there is an existing intermediate state 108. The intermediate state 108 includes information including (1) the current decompression bit position (i.e., the bit position that the decompression process has moved to), and (2) the content of the current reference window.

Figure 5:
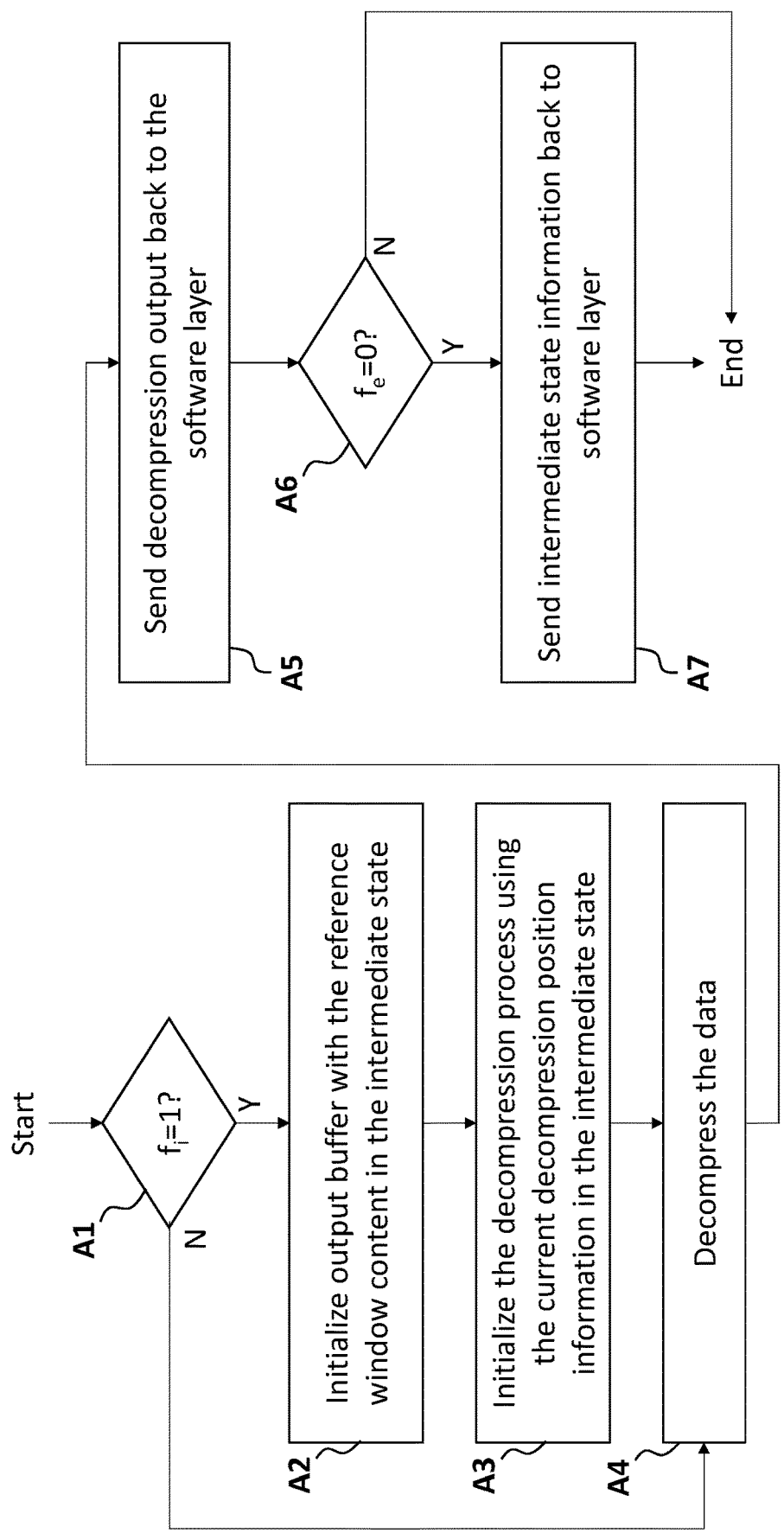
FIG. 5 illustrates the operational flow of the hardware engine of the hybrid-software/hardware architecture according to embodiments of the disclosure.

FIG. 5, described below in conjunction with FIGS. 3 and 4, illustrates the corresponding operational flow of the hardware engine 106 according to embodiments of the disclosure. At process A1, if the flag $f_i$ received by the decompression processing unit 118 of the hardware engine 106 is 0 (N at process A1), flow passes to process A4. If the flag $f_i$ received by the decompression processing unit 118 is 1 (Y at process A1) (i.e., indicating that there is an existing intermediate state 108), the output buffer 120 is initialized at process A2 with the reference window content in the intermediate state 108 (i.e., the reference window content is stored in the output buffer 120). As described above, the decompression processing unit 118 of the hardware engine 106 receives the intermediate state 108 and the flags $f_i$ and $f_e$ from the software layer 104 of the host computer 112.

At process A3, the decompression processing unit 118 of the hardware engine 106 initializes the decompression process using the current decompression bit position information in the intermediate state 108 received from the software layer 104. At process A4, the to-be-compressed data 122 in the input buffer 116 is decompressed by the decompression processing unit 118 and the decompressed bitstream is stored in the output buffer 120. At process A5, the decompression output in the output buffer 120 is sent back to the software layer 104.

If the flag $f_e$ is 0 (Y at process A6) (i.e., the current to-be-decompressed data is not the last portion of an entire to-be-decompressed data block), the decompression processing unit 118 of the hardware engine 106 sends a corresponding updated intermediate state 108 back to the software layer 104 of the host computer 112 at process A7, which stores it in the memory 110. The updated intermediate state 108 sent back to the software layer 104 includes an updated decompression bit position (i.e., the bit position that the decompression process has moved to after the decompression of the to-be-decompressed data 122) and an updated reference window that now includes the decompressed bitstream corresponding to the to-be-decompressed data 122. If the flag $f_e$ is 1 (N at process A6) (i.e., the current to-be-decompressed data is the last portion of an entire to-be-decompressed data block), the process ends.

Software Layer

The software layer 104 may provide an API (application programming interface) through which user applications 102 can call the decompression function provided by the hardware engine 106. Through the API, user applications 102 may pass the to-be-decompressed data 122, and receive the decompressed data. Since the decompression process supports stateful decompression, the user applications 102 may pass a block of the to-be-decompressed data 122 to the hardware engine 106 portion-by-portion instead of passing the entire block of to-be-decompressed data 122 at once. The software layer 104 may optionally choose to internally buffer the to-be-decompressed data 122 before sending the to-be-decompressed data 122 to the hardware engine 106 for decompression. When the buffered data is large enough, the software layer 104 sends the to-be-decompressed data 122 to the hardware engine 106. If the data are not the first portion of the block of the to-be-decompressed data 122, the software layer 104 also sends the intermediate state 108 to the hardware engine 106. The software layer 104 also sends the corresponding flags (i.e., $f_e$ and $f_i$) to the hardware engine 106. If this is not the last portion of the entire block of to-be-decompressed data 122, the software layer 104 receives the intermediate state 108 from hardware engine 106 and stores it in memory 110.

Figure 6:
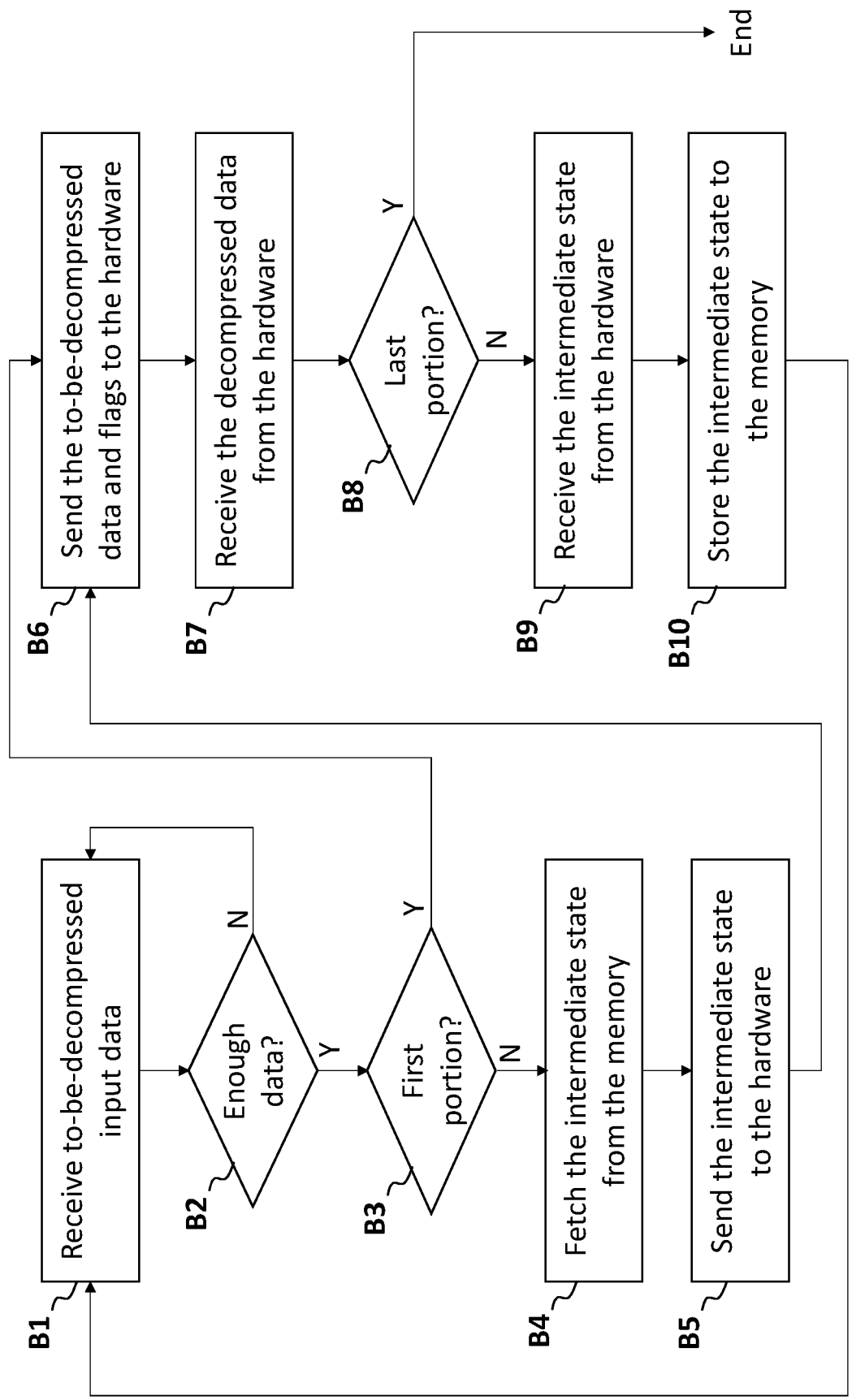
FIG. 6 illustrates the operational flow of the software layer of the hybrid-software/hardware architecture according to embodiments of the disclosure.

FIG. 6 illustrates the operational flow of the software layer 104 of the host computer 112 according to embodiments. At process B1, the software layer 104 receives a block of to-be-decompressed data 122 (e.g., from a user application 102). In optional process B2, the software layer 104 waits (N at process B2) until enough to-be-decompressed data 122 has been received. If enough to-be-decompressed data 122 has been received (Y at process B2), flow passes to process B3.

If the software layer 104 receives the first portion of a block of to-be-decompressed data 122 (Y at process B3), flow passes to process B6. Otherwise (N at process B3), flow passes to process B4 where the corresponding intermediate state 108 is fetched from the memory 110. At process B5, the intermediate state 108 is sent to the hardware engine 106. Flow then passes to process B6.

At process B6, the software layer 104 sends the to-be-decompressed data 122 and flags $f_e$, and $f_i$ to the hardware engine 16 for decompression. At process B7, the software layer 104 receives the decompressed data from the hardware engine 106. If the decompressed data includes the last portion of the data to be decompressed (Y at process B8), the process ends. If not (N at process B8), the software layer 104 receives the intermediate state 108 from the hardware engine 106 at process B9 and stores the received intermediate state 108 in the memory 110 at process B10. Flow then returns to process B1.

It is understood that aspects of the present disclosure may be implemented in any manner, e.g., as a software program, or an integrated circuit board or a controller card that includes a processing core, I/O and processing logic. Aspects may be implemented in hardware or software, or a combination thereof. For example, aspects of the processing logic may be implemented using field programmable gate arrays (FPGAs), ASIC devices, or other hardware-oriented systems.

Aspects may be implemented with a computer program product stored on a computer readable storage medium. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, etc. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Python, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

The computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. The computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by hardware and/or computer readable program instructions.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The foregoing description of various aspects of the present disclosure has been presented for purposes of illustration and description. It is not intended to be exhaustive or to limit the concepts disclosed herein to the precise form disclosed, and obviously, many modifications and variations are possible. Such modifications and variations that may be apparent to an individual in the art are included within the scope of the present disclosure as defined by the accompanying claims.

The invention claimed is:

1. A hardware decompression acceleration engine, comprising:
an input buffer for receiving to-be-decompressed data from a software layer of a host computer;
a decompression processing unit coupled to the input buffer for decompressing the to-be-decompressed data, the decompression processing unit further receiving first and second flags from the software layer of the host computer, wherein the first flag is indicative of a location of the to-be-decompressed data in a to-be-decompressed data block and the second flag is indicative of a presence of an intermediate state; and
an output buffer for storing decompressed data from the decompression processing unit,
wherein the decompression processing unit further receives an intermediate state including a reference window content and a current decompression bit position from the software layer of the host computer if the to-be-decompressed data is not a last portion of the to-be-decompressed data block, and wherein the output buffer is initialized with the reference window content of the intermediate state.

2. The hardware decompression acceleration engine of claim 1, wherein the decompression processing unit is configured to send the decompressed data in the output buffer to the software layer of the host computer.

3. The hardware decompression acceleration engine of claim 1, wherein the first flag indicates whether the to-be-decompressed data received by the input buffer from the software layer of the host computer is a last portion of the to-be-decompressed data block.

4. The hardware decompression acceleration engine of claim 1, wherein the decompression processing unit is initialized with the current decompression bit position.

5. The hardware decompression acceleration engine of claim 1, wherein, if the first flag indicates that the to-be-decompressed data is not the last portion of the to-be-decompressed data block, the decompression processing unit is configured to send an updated intermediate state to the software layer of the host computer after decompressing the to-be-decompressed data.

6. A hybrid software and hardware decompression system, comprising:
a host computer including a software layer and a memory; and
a hardware decompression acceleration engine coupled to the host computer, wherein the hardware decompression acceleration engine includes:
an input buffer for receiving to-be-decompressed data from the software layer of the host computer;
a decompression processing unit coupled to the input buffer for decompressing the to-be-decompressed data, the decompression processing unit further receiving first and second flags from the software layer of the host computer, wherein the first flag indicates whether the to-be-decompressed data received by the input buffer from the software layer of the host computer is a last portion of a to-be-decompressed data block and the second flag is indicative of a presence of an intermediate state; and
an output buffer for storing decompressed data from the decompression processing unit,
wherein, if the to-be-decompressed data is not the last portion of the to-be-decompressed data block, the software layer is configured to fetch an intermediate state including a reference window content and a current decompression bit position from the memory of the host computer and send the intermediate state to the decompression processing unit, and wherein the output buffer is initialized with the reference window content of the intermediate state.

7. The hybrid software and hardware decompression system of claim 6, wherein the decompression processing unit is configured to send the decompressed data in the output buffer to the software layer of the host computer.

8. The hybrid software and hardware decompression system of claim 6, wherein the decompression processing unit is initialized with the current decompression bit position.

9. The hybrid software and hardware decompression system of claim 6, wherein, if the first flag indicates that the to-be-decompressed data is not the last portion of the to-be-decompressed data block, the decompression processing unit is configured to send an updated intermediate state to the software layer of the host computer after decompressing the to-be-decompressed data, the software layer storing the updated intermediate state in the memory of the host computer.

10. A hybrid software and hardware decompression method, comprising:
  receiving, at an input buffer of a hardware decompression acceleration engine coupled to a host computer, to-be-decompressed data from a software layer of the host computer, the hardware decompression acceleration engine further including a decompression processing unit and an output buffer;
  decompressing the to-be-decompressed data via the decompression processing unit;
  receiving, at the decompression processing unit, first and second flags from the software layer of the host computer, wherein the first flag indicates whether the to-be-decompressed data received by the input buffer from the software layer of the host computer is a last portion of a to-be-decompressed data block and the second flag is indicative of a presence of an intermediate state;
  wherein, if the to-be-decompressed data is not the last portion of the to-be-decompressed data block, fetching, by the software layer, an intermediate state including a reference window content and a current decompression bit position from a memory of the host computer, and sending the intermediate state to the decompression processing unit;
  initializing the output buffer with the reference window content of the current intermediate state;
  storing decompressed data from the decompression processing unit in the output buffer; and
  sending the decompressed data in the output buffer to the software layer of the host computer.

11. The hybrid software and hardware decompression method of claim 10, further comprising:
  initializing the decompression processing unit with the current decompression bit position.

12. The hybrid software and hardware decompression method of claim 11, wherein, if the first flag indicates that the to-be-decompressed data is not the last portion of the to-be-decompressed data block:
  updating, by the decompression processing unit, the intermediate state;
  sending, by the decompression processing unit, the updated intermediate state to the software layer of the host computer after decompressing the to-be-decompressed data; and
  storing, by the software layer, the updated intermediate state in the memory of the host computer.

* * * * *